United States Patent [19]
Gustafson

[11] Patent Number: 4,750,957
[45] Date of Patent: Jun. 14, 1988

[54] METHOD OF MAKING A SHIELD THAT IS SUBSTANTIALLY OPAQUE TO ELECTROMAGNETIC RADIATION

[76] Inventor: Ake Gustafson, La Coudraie, CH-1618 Chatel-St-Denis, Switzerland

[21] Appl. No.: 931,443

[22] PCT Filed: Feb. 20, 1986

[86] PCT No.: PCT/SE86/00077
§ 371 Date: Oct. 22, 1986
§ 102(e) Date: Oct. 22, 1986

[87] PCT Pub. No.: WO86/05062
PCT Pub. Date: Aug. 28, 1986

[30] Foreign Application Priority Data
Feb. 22, 1985 [SE] Sweden ................ 8500885

[51] Int. Cl.⁴ ................ B32B 31/12; B32B 7/08
[52] U.S. Cl. ................ 156/92; 156/272.4; 156/275.3; 156/304.4; 174/35 MS; 428/61

[58] Field of Search ............ 156/272.4, 92, 304.4, 156/275.3; 174/35 MS; 428/61

[56] References Cited

U.S. PATENT DOCUMENTS 4,067,765 1/1978 Heller et al. ............... 156/272.4
4,126,287 11/1978 Mendelsohn et al. ...... 174/35 MS X
4,410,575 10/1983 Obayashi et al. ........... 156/275.3 X

FOREIGN PATENT DOCUMENTS 488225 7/1938 United Kingdom ............ 156/304.4

Primary Examiner—Robert A. Dawson
Attorney, Agent, or Firm—Hill, Van Santen, Steadman & Simpson

[57] ABSTRACT

A shield which is substantially opaque to electro-magnetic radiation is formed by connecting together webs or strips of a sheet of metallized flexible shielding material, the pieces being placed together in overlapping or abutting relation and secured by a fluid-permeable shielding material. The shielding portions are joined together by an electrically conductive glue.

15 Claims, 1 Drawing Sheet

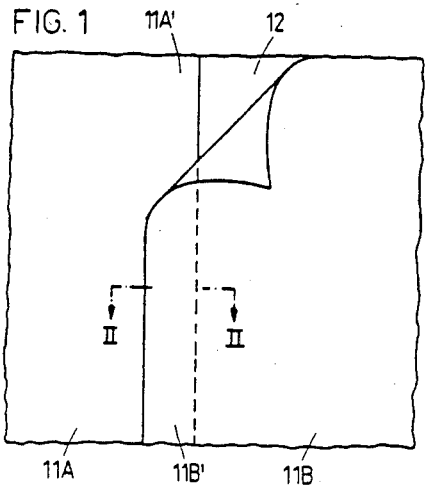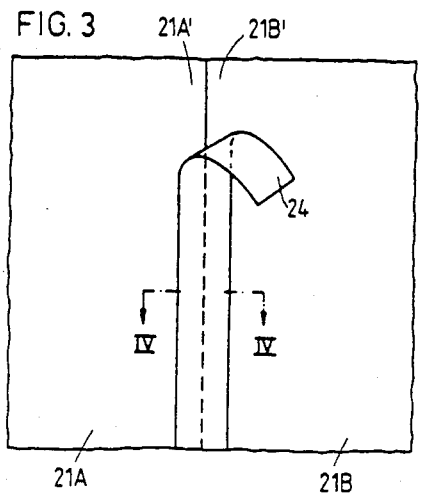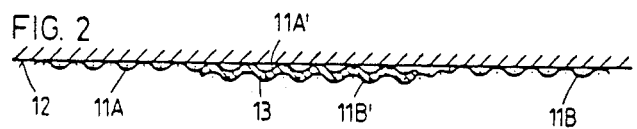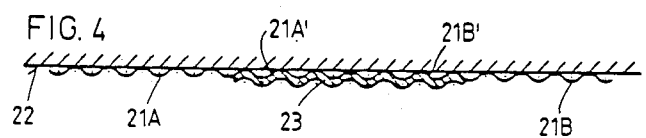

METHOD OF MAKING A SHIELD THAT IS SUBSTANTIALLY OPAQUE TO ELECTROMAGNETIC RADIATION

This invention relates to a method of making a shield that is substantially opaque to electromagnetic radiation, which method comprises joining together pieces of flexible metallic or metallized shielding material of sheet form.

The need to protect certain types of electronic equipment, such as telecommunications and computer equipment, against perturbations induced by electromagnetic radiation, or to prevent radiation emitted by such equipment from diffusing in an undesirable manner, has become increasingly apparent because of the increasing knowledge of the damage that such radiation can induce.

Protection can be provided by a shield which completely encloses the space to be protected and which is substantially opaque to radiation in the frequency range of interest or, in other words, sufficiently difficult for the radiation to penetrate. Such shields can be made of materials which are either essentially absorptive towards the radiation or essentially reflective (in which case the shield forms a so-called Faraday cage) or of combinations of the two.

An essentially reflective shield can be made of metal foils or sheets which are welded or soldered together to form a cage or other enclosure. The cage may have openings for the passage of electricity, fluids, etc. which must be provided with closing systems that prevent radiation from passing through them.

A shield constructed in this manner using conventional techniques is, as can be easily seen, very expensive if it has to be provided around an already existing space. It can therefore be justified only in particular cases where high costs can be tolerated.

Another way of making a shield is to paint the surfaces defining the space to be shielded with an electrically conductive paint. Paint having sufficiently high electrical conductivity exists but is very expensive and thus cannot be used where high costs are unacceptable. Another drawback is that cracks in the painted surface easily lead to cracks in the applied layer of paint so that the shielding effect is reduced or entirely disappears.

It has also been proposed to use metallized textiles as shielding material.

Commercially available metallized textile materials are of woven, knitted or nonwoven construction and based on synthetic or natural polymers, inorganic fibres, carbon fibres, etc. subsequently covered with a metallic coating. Typically, they have a surface resistance substantially less than say 30 ohms and possess suitable mechanical properties (the term "surface resistance" here denotes the electrical resistance of a square piece of the material as measured between opposed edges of the square).

A practical problem in using metallized textile materials for shielding purposes is to achieve a shield where in terms of electrical properties the joints between adjacent pieces of the material are sufficiently similar to the bulk of the material. Incidentally, this problem is not satisfactorily solved for other shielding materials either, since welded or soldered joints between sheet metal pieces as well as conductive paint layers can have, or develop, hidden cracks or other discontinuities which reduce the shielding effect.

An object of this invention is to provide a method of making a shield using a metallic or metallized flexible shielding material of sheet form which method solves the above-explained problems while meeting electromagnetic, constructional and economic requirements.

This object is achieved by making the shield according to the method set forth in the claims.

Briefly, the invention comprises joining adjacent shielding material pieces together through an overlap joint, at least one of the overlapping portions being formed of a fluid-permeable shielding material and joined with the other overlapping portion through an electrically conductive glue applied in fluid state, whereby the joint provides an electrical path of a resistance approximately equal to or less than that of the bulk of the shielding material.

The method of the invention can take many forms according to the particular shielding material used and the circumstances of each particular case. It has been shown to be useful for frequences from below 10 kHz to above 500 MHz.

The fluid-permeable shielding material must be so flexible that the glue can hold the overlapping portions together through its surface tension as it solidifies. It has been found preferable to use shielding material in the shape of metallized textile material, e.g. nickel coated polyester monofilament fabric, of the types marketed by Devex S.A., CH-1618 Châtel-St-Denis, Switzerland, at least for the portions of the shielding material that have to be fluid-permeable.

According to the invention, the electrical connection between the overlapping shielding material pieces is formed essentially by the electrically conductive glue. The glue need not, however, have a very high electrical conductivity, as the distance between the overlapping portions is very small. In practice, graphite based paints, e.g. Dag 564, Electrodag 5405A, or nickel based types, e.g. Electrodag 440AS, all marketed by Acheson Colloids, N.V., Scheemda, Holland, suitably diluted to allow optimal penetration, provide a good compromise of cost and effectiveness. In general, glues presenting a surface resistance of not more than 10000 ohms at 25 microns sheet thickness are preferred.

The invention will be further elucidated with reference to a number of examples and to the accompanying diagrammatic drawing, in which:

FIG. 1 is a fragmentary front view of a shield made according to the method of the invention;

FIG. 2 is an enlarged cross-sectional view taken on line II—II of FIG. 1 and illustrating a joint connecting overlapping portions of neighbouring shielding material bands or webs together;

FIG. 3 is a view similar to FIG. 1 showing a modified shield made according to the method of the invention;

FIG. 4 is an enlarged cross-sectional view taken on line IV—IV of FIG. 3 and showing a different type of joint between neighbouring shielding material bands or webs.

EXAMPLE 1

An existing room of 3 m×3 m×3 m and having two windows, one door and passages for power supply and other service facilities was shielded. Lengths of metallized textile webs ("DEVEX" PMO 400 - nickel coated polyester monofilament woven fabric, thread diameter 30 microns, thread count 120 threads/cm for both warp and weft, non-metallized weight 35 g/m$^2$, metallized weight 70 g/m$^2$, surface resistance less than 0,1 ohm)

were attached to the walls, floor and ceiling of the room in wallpaper-hanging fashion such that contiguous longitudinal marginal portions overlapped by about 5 cm ("single overlap") as illustrated in FIG. 1 which shows portions of a pair of adjacent overlapping lengths 11A and 11B.

A non-conductive wall-paper paste was used to fix the lengths 11A and 11B to the support surface 12. An electrically conductive glue in liquid form, Electrodag 5405A, was applied by a paint brush to the outer or exposed surface of the overlying or outer overlapping portion 11B' of each length. The glue penetrated this overlapping portion and upon drying joined it firmly with the underlying or inner overlapping portion 11A' of each length.

FIG. 2 shows a diagrammatic cross-section through the finished joint, the glue interconnecting the overlapping marginal portions 11A' and 11B' being designated by the numeral 13.

Special arrangements were made to shield the windows, doors and service passages.

Testing of the shielded room in accordance with U.S. Military Specification MIL-STD 285 showed electrical field shielding of greater than 60 dB between 0.25 and 200 MHz and magnetic field shielding of greater than 50 dB at 20 MHz, dropping to greater than 15 dB at 0.25 MHz.

The electrical integrity of the overlap joints could be easily checked by inspection through outer or overlying portions of the fluid-permeable shielding material webs.

EXAMPLE 2

A shield was made generally in accordance with the procedure of Example 1 with the modifications apparent from FIGS. 3 and 4. Thus, the lengths 21A, 21B of shielding material webs (FIG. 3) were attached to the support surface 22 with adjacent longitudinal edges in non-overlapping position but closely spaced, and a separate overlap strip 24 of 10 cm width ("DEVEX" PMO 400 or "DEVEX" PJ 100, a metallized polyester interlock jersey material) was applied overlapping the adjacent marginal portions 21A' and 21B' of the lengths and "painted" with the electrically conductive glue.

The shielding effect was comparable to that achieved with the shielding of Example 1.

EXAMPLE 3

Two 18 cm×18 cm samples of "DEVEX" NT 100 (a metallized "Nomex" based twill weave textile material of much reduced flammability compared with the polyester based materials) were taken. Their surface resistances were respectively 153 and 121 milliohms.

The samples were cut in half. One of the halves of each sample was primed with Electrodag 5405A conductive paint over a marginal portion 1 cm wide for one of the samples and 2 cm wide for the other sample. The other half of each sample was then placed in overlapping position on the primed portion of the first half, and Electrodag 5405A conductive paint was applied to the outer or exposed side of the overlapping portion of each second half as described with reference to Example 1 and allowed to dry.

The surface resistance were measured across the joints and was 163 milliohms for the first sample and 128 milliohms for the second sample, i.e. the surface resistance was almost the same as that of the bulk material.

Weighing of the jointed portions of the samples showed that they contained about 50 mg of dried glue per square cm.

This example indicates that it may be advantageous to prime the underlying or inner overlapping portion with the conductive glue before the rest of the conductive glue is applied to and penetrates the overlying or outer overlapping portion, particularly when the fluid permeability of the outer overlapping shielding material is relatively low or the material is relatively thick.

EXAMPLE 4

Shielding material pieces were joined through overlap joints of the types produced according to Examples 1 and 2 with the pieces temporarily spread on a support of a material (e.g. Teflon ®) to which the electrically conductive glue did not adhere firmly. Shielding material pieces joined in this manner and only partly or not at all attached to a support surface can be used to provide mobile shields in the form of tents, bags, etc. If necessary, the joints can be protected by applying adhesive tape or the like to them.

EXAMPLE 5

A shield was made in accordance with the procedure of Example 1 with the modification that the shielding material webs were fixed to the support surface by means of mechanical fasteners, namely staples.

I claim:

1. Method of making a shield that is substantially opaque to electromagnetic radiation, in which pieces of metallic or metallized flexible shielding material of sheet form are joined together, characterised in that adjacent pieces of the shielding material are arranged in overlapping relation, at least one of the overlapping portions being formed of a fluid-permeable piece of the shielding material, and in that the overlapping portions are joined together by an electrically conductive glue.

2. Method according to claim 1, characterised by the use of a metallized textile material for the fluid-permeable piece of the shielding material forming said overlapping portion.

3. Method according to claim 1, characterised by the use of a metallized textile material, for the shielding material.

4. Method according to claim 3, characterised in that the pieces of shielding material are arranged with a simple overlap.

5. Method according to claim 1, characterised in that the pieces of shielding material are arranged in adjacent but essentially non-overlapping relationship, and in that an overlap strip of the fluid-permeable shielding material is then applied over adjacent marginal portions of adjacent pieces.

6. Method according to claim 1, characterised in that the pieces of shielding material are in band or web form.

7. Method according to claim 1 characterised in that the pieces of shielding material are attached to a support surface, at least the overlying or outer overlap portion being formed of the fluid-permeable shielding material.

8. Method according to claim 7, characterised in that the pieces of shielding material are fixed to the support surface by means of substantially non-conductive glue or paste.

9. Method according to claim 6, characterised in that the pieces of shielding material are fixed to the support surface by means of mechanical fastening means.

10. Method according to claim 14, characterised in that the electrically conductive glue is applied to the exposed side of the overlying overlapping portion.

11. Method according to claim 15, characterised in that the electrically conductive glue is applied to the exposed side of the overlap strip.

12. Method according to claim 2, characterized by the use of a metallized textile material, for the shielding material.

13. Method according to claim 2, characterized in that the pieces of shielding material are arranged in adjacent but essentially non-overlapping relationship, and in that an overlap strip of the fluid-permeable shielding material is then applied over adjacent marginal portions of adjacent pieces.

14. Method according to claim 4, characterized in that the pieces of shielding material are attached to a support surface, at least the overlying or outer overlap portion being formed of the fluid-permeable shielding material.

15. Method according to claim 5, characterized in that the pieces of shielding material are attached to a support surface, at least the overlying or outer overlap portion being formed of the fluid-permeable shielding material.

* * * * *